(12) United States Patent
Wong et al.

(10) Patent No.: US 7,576,570 B1
(45) Date of Patent: Aug. 18, 2009

(54) SIGNAL AMPLITUDE DETECTION CIRCUITRY WITHOUT PATTERN DEPENDENCIES FOR HIGH-SPEED SERIAL LINKS

(75) Inventors: Wilson Wong, San Francisco, CA (US); Sergey Shumarayev, San Leandro, CA (US); Simardeep Maangat, Sunnyvale, CA (US); Thungoc M. Tran, San Jose, CA (US); Tim Tri Hoang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 97 days.

(21) Appl. No.: 11/508,607

(22) Filed: Aug. 22, 2006

(51) Int. Cl.
*H03K 5/153* (2006.01)

(52) U.S. Cl. .............. 327/60; 327/63; 327/72; 327/73

(58) Field of Classification Search ............ None
See application file for complete search history.

(56) References Cited

U.S. PATENT DOCUMENTS

| | | | | |
|---|---|---|---|---|
| 4,075,514 A * | 2/1978 | Sequin | ................... | 327/56 |
| 4,104,545 A | 8/1978 | Dallas et al. | ................... | 327/70 |
| 5,331,210 A | 7/1994 | McCarroll | ................... | 327/58 |
| 5,589,778 A * | 12/1996 | Ono et al. | ................... | 324/654 |
| 5,600,284 A * | 2/1997 | Nguyen et al. | ............ | 331/177 R |
| 5,689,195 A | 11/1997 | Cliff et al. | ................... | 326/41 |
| 5,838,197 A * | 11/1998 | Tsukuda | ................... | 330/252 |
| 5,909,126 A | 6/1999 | Cliff et al. | ................... | 326/41 |
| 6,215,326 B1 | 4/2001 | Jefferson et al. | ........... | 326/41 |
| 6,407,576 B1 | 6/2002 | Ngai et al. | ................... | 326/41 |
| 6,492,851 B2 * | 12/2002 | Watarai | ................... | 327/158 |
| 6,650,140 B2 | 11/2003 | Lee et al. | ................... | 326/59 |
| 7,053,674 B1 * | 5/2006 | Romero et al. | ............. | 327/94 |
| 7,088,163 B1 * | 8/2006 | Bell et al. | ................... | 327/271 |
| 2001/0033188 A1 | 10/2001 | Aung et al. | ................ | 327/141 |
| 2005/0285633 A1 * | 12/2005 | Nakamura | .................. | 327/58 |

\* cited by examiner

*Primary Examiner*—Tuan Lam
*Assistant Examiner*—Hiep Nguyen
(74) *Attorney, Agent, or Firm*—Brian E. Mack; Ropes & Gray LLP

(57) ABSTRACT

Precision amplitude detection circuitry without pattern dependencies is provided that includes rectifier circuitry to output a rectified voltage signal and delay circuitry to send one or more delayed or phase-shifted versions of a differential signal input to the rectifier circuitry. The delayed versions of the differential signal input may be delayed in order to reduce or eliminate the dips in the input seen by the rectifier. This may help correct for low rectified voltage levels. The signal amplitude detection circuitry of the present invention may be incorporated on the input pin of any programmable logic resource and may be included in communication circuitry of a PLD. The precision amplitude detection circuitry may operate in the Gbps (gigabit per second) range.

18 Claims, 9 Drawing Sheets

300

400

US 7,576,570 B1

SIGNAL AMPLITUDE DETECTION CIRCUITRY WITHOUT PATTERN DEPENDENCIES FOR HIGH-SPEED SERIAL LINKS

BACKGROUND OF THE INVENTION

This invention relates generally to field programmable gate array ("FPGA") integrated circuit devices, such as programmable logic devices ("PLDs"), and other integrated circuits of that general type (all generically referred to for convenience as PLDs). More particularly, the invention relates to circuitry for precision signal amplitude detection without pattern dependencies for inclusion on PLDs.

PLDs are intended to be relatively general-purpose devices. A PLD can be programmed (i.e., configured) and/or otherwise controlled to meet any need within the range of needs that the PLD is designed to support. A PLD may be equipped with high-speed serial data communication circuitry, whereby the PLD can transmit serial data to and/or receive serial data from circuitry that is external to the PLD. In that case, it is desirable for the high-speed serial data communication circuitry of the PLD to be able to support various communication protocols that various users of the PLD product may wish to employ.

In the case of high-speed serial data transmitter circuitry on a PLD, one of the tasks that such circuitry typically needs to perform is serialization of data from the parallel form in which it is typically generated and/or handled in the core logic circuitry of the PLD to the serial form in which the transmitter transmits it off the PLD.

In the case of high-speed serial data receiver circuitry on a PLD, one of the tasks that such circuitry typically needs to perform is deserialization of data from the serial form in which it is typically received from a source external to the PLD to the parallel form in which the receiver circuitry preferably hands the data off to other circuitry of the PLD (e.g., the core logic circuitry of the PLD). As such, many PLDs include integrated high-speed serializer/deserializer circuitry.

High-speed differential serializer/deserializer applications typically require the ability to detect extremely small differential input amplitudes to indicate a valid level. For example, in some signaling standards, such as PCI Express, a circuit must be capable of detecting differential signal amplitudes as small as 165 mV (peak-to-peak) at very high speeds. It is extremely difficult to design an accurate signal detector for these small amplitudes without pattern dependencies at gigabit per second data rates.

Amplitude detection (or peak detection) is also used in many other applications other than differential signaling. For example, amplitude detection may be useful in envelope detection and for extracting the absolute value of a signal. However, a transitioning differential signal has dips or levels lower than the signal's DC value. The dips are pattern-dependent, since more dips are seen in signals with higher transition densities. This may result in rectified voltage levels which are also pattern-dependent. This pattern-dependency is highly undesirable, especially in high-speed differential signaling standards, where accurately detecting very small voltage amplitudes is crucial.

Accordingly, it is desirable to provide precision circuitry for amplitude detection without pattern dependencies. The detection circuitry may be integrated with high-speed serial data communication circuitry of a PLD. For example, the amplitude detection circuitry may be integrated on one or more input pins of a PLD. The high-speed serial data communication circuitry and the precision amplitude detection circuitry may operate in the Gbps (gigabit per second) range.

SUMMARY OF THE INVENTION

In accordance with the invention, precision signal amplitude detection circuitry is provided that includes delay circuitry to send one or more delayed or phase-shifted versions of a differential input signal to rectifier circuitry. The rectifier circuitry is configured to output a rectified voltage signal.

In some embodiments, the rectifier circuitry may include an operational amplifier in a voltage follower configuration. The operational amplifier may include charge and discharge current sources integrated with or coupled to the operational amplifier. In some embodiments, the charge current is much greater than the discharge current. An integration capacitor may be used to average out the rectified output of the rectifier circuitry in order to reduce any instantaneous transient effects.

The rectifier circuitry receives one or more delayed versions of the differential input signals from delay circuitry. The delay circuitry includes one or more delay stages designed to eliminate or reduce the dips in the rectifier circuitry input. This may help correct low rectified voltage levels resulting from signals with high transition densities. Each delay stage may phase shift the rectifier input signal by some amount. In some embodiments, each delay stage shifts the input signal by a fixed amount. In other embodiments, each delay stage shifts the input signal by a variable amount. The delay circuitry may then send the delayed version or versions of the rectifier input to the rectifier without attenuation. The rectified voltage level is then computed by the rectifier circuitry, and the amplitude of the input signal is detected.

Further features of the invention, its nature and various advantages, will be more apparent from the accompanying drawings and the following detailed description.

DETAILED DESCRIPTION OF THE PREFERRED EMBODIMENTS

Figure 1:
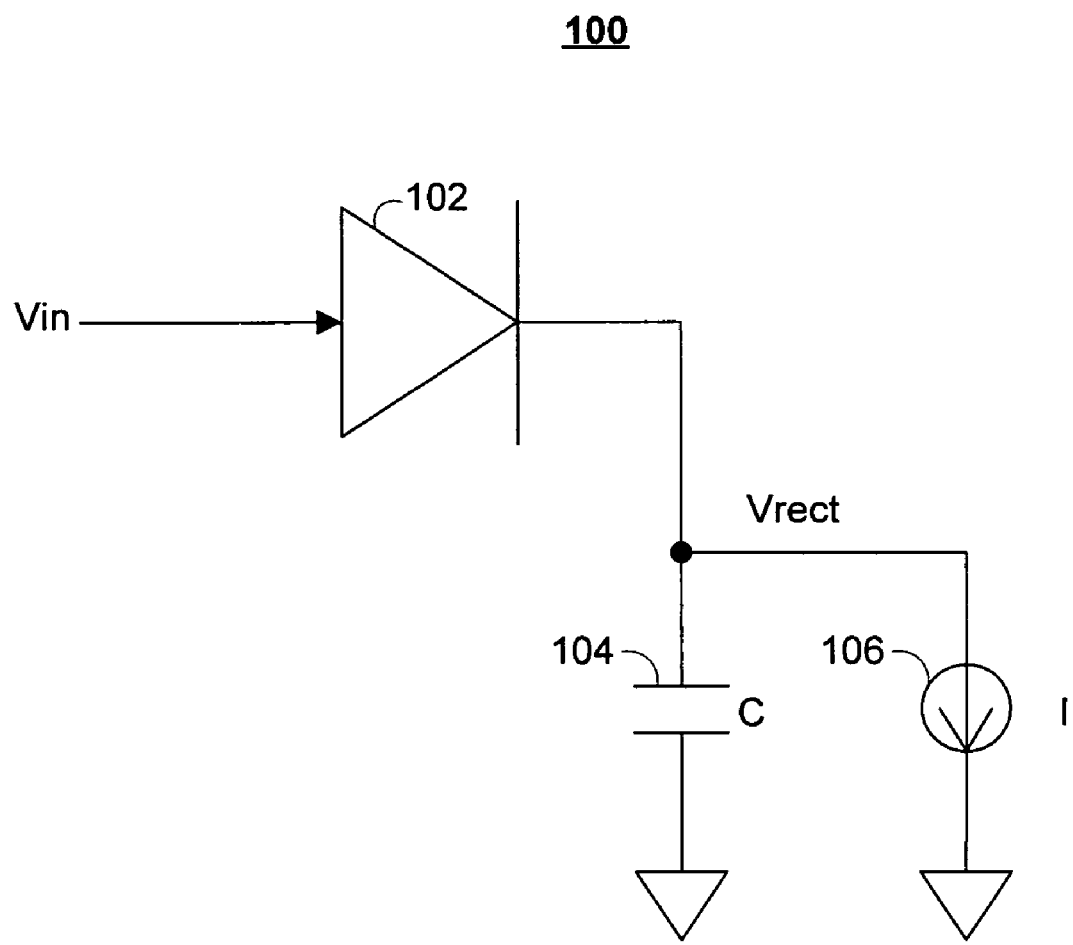
FIG. 1 is a simplified schematic block diagram of typical amplitude detection circuitry.

FIG. 1 shows typical signal amplitude detection circuitry 100. A voltage signal is received on a single trace by diode 102. A diode is often used in a peak detector because it limits current flow in one direction. However, in a normal silicon diode at rated currents, the voltage drop across the terminals of the conducting diode is approximately 0.7 volts. Capacitor 104 is then charged to the maximum rectified voltage level, $V_{rect}$. Thus, in the example of FIG. 1, $V_{rect}$ is approximately equal to 0.7 volts less than the input voltage. When the amplitude of the input voltage falls, a discharge current (also sometimes called a bleed or leakage current herein) reduces the capacitor voltage. For example, discharge current 106 may cause the voltage of capacitor 104 to drop to the new amplitude of the input voltage signal less 0.7 volts.

Figure 2:
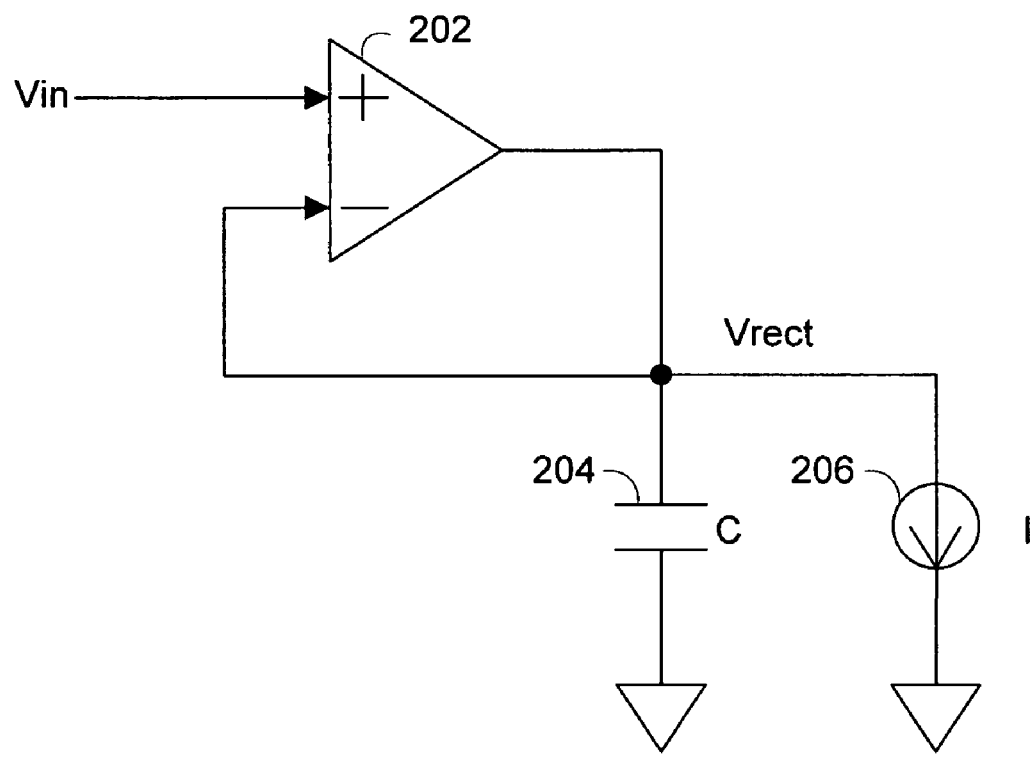
FIG. 2 is a simplified schematic block diagram of illustrative amplitude detection circuitry in accordance with one embodiment of the invention.

It should be evident that amplitude detection circuitry 100 is far from ideal. For example, diode 102 causes a drop in the rectified voltage output of the diode of approximately 0.7 volts, which is highly undesirable, especially when detecting very small signal amplitudes. Therefore, FIG. 2 shows an improved signal detection circuitry 200. The diode of FIG. 1 is replaced with operational amplifier 202. As shown in FIG. 2, operational amplifier 202 is sometimes referred to as a voltage follower, or buffer amplifier, because it provides high impedance, a low output impedance, and unity gain. As the voltage changes, the output and inverting input will change by an equal amount. Thus, operational amplifier 202 simply makes a copy of the input voltage at the output without drawing any current from the input. The output of operational amplifier 202 therefore follows the input voltage.

Figure 3:
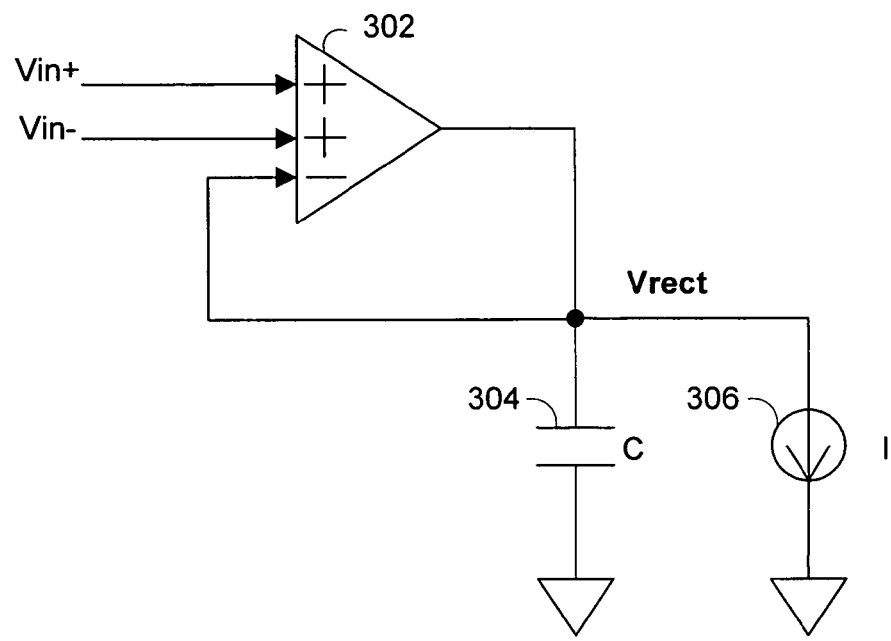
FIG. 3 is the differential version of FIG. 2 in accordance with one embodiment of the invention.
Figure 4:
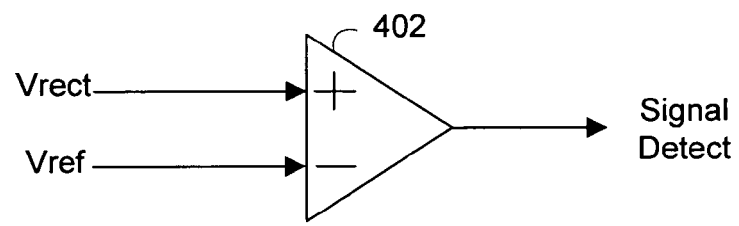
FIG. 4 is illustrative signal amplitude comparison circuitry in accordance with one embodiment of the invention.

Amplitude detection circuitry 200 also includes capacitor 204 and discharge current 206, serving similar functions as capacitor 104 and discharge current 106 of FIG. 1. The differential version of amplitude detection circuitry 200 is shown in FIG. 3 as differential amplitude detection circuitry 300. Differential amplitude detection circuitry 300 is responsive to a pair of differential signal traces, Vin+ and Vin−. The output of operational amplifier 302 is like an "OR" function in that the highest of the two signal inputs is used for the rectified output, $V_{rect}$. In a typical application, the rectified voltage output, $V_{rect}$, may be compared to known or fixed reference voltage to determine if the signal amplitude has reached a certain threshold level. As shown in FIG. 4, circuitry 400 compares the rectified voltage to a reference voltage. Assuming there is no hysteresis, as soon as the amplitude of $V_{rect}$ is greater than the reference voltage threshold, a signal detect output signal may be asserted (e.g., SD=1). Once the amplitude drops below the reference voltage, the SD signal may be deasserted (e.g., SD=0).

Figure 7:
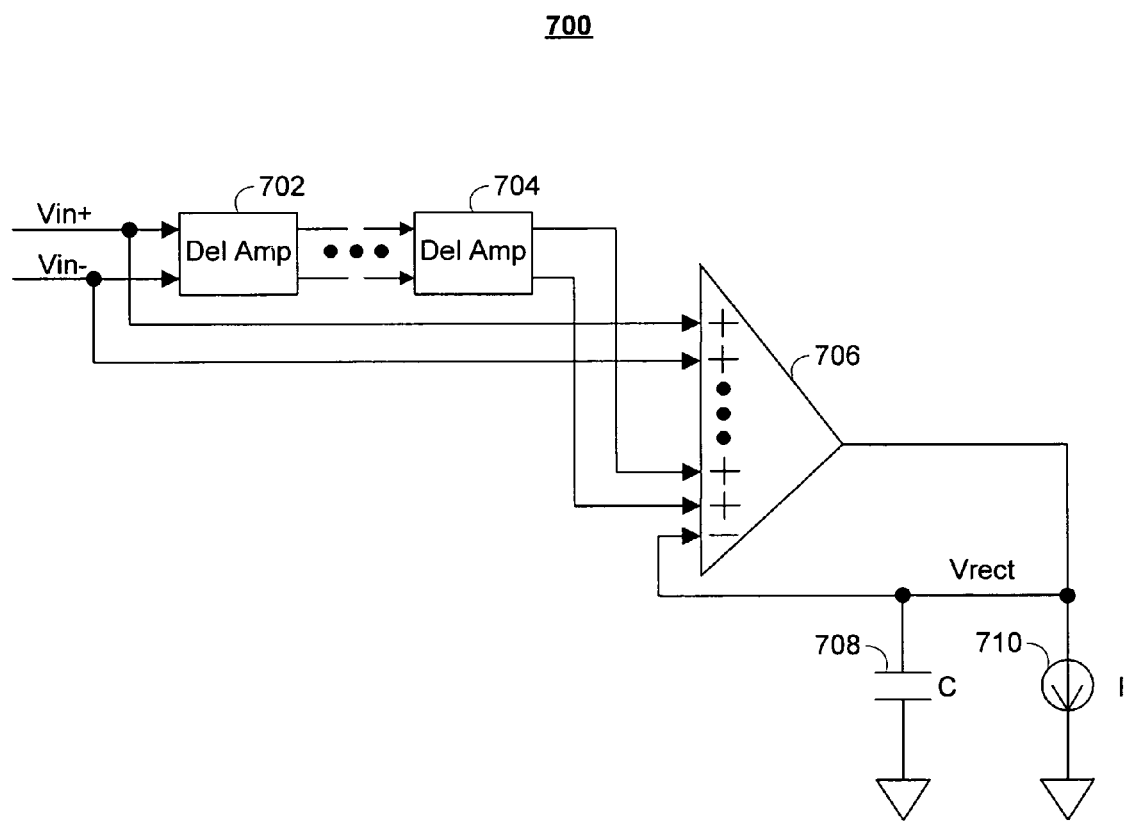
FIG. 7 is a simplified schematic block diagram of an illustrative embodiment of the differential amplitude detection circuitry in accordance with the invention.

Signal amplitude detection, or peak detection, is accomplished using the circuitry of FIGS. 2, 3, and 7 by proper design of the charge and discharge currents. Although the discharge current (and optionally the charge current (not shown)) may be external to the operational amplifiers, in a real implementation, both the charge and discharge currents may be integrated with the operational amplifier.

Figure 5:
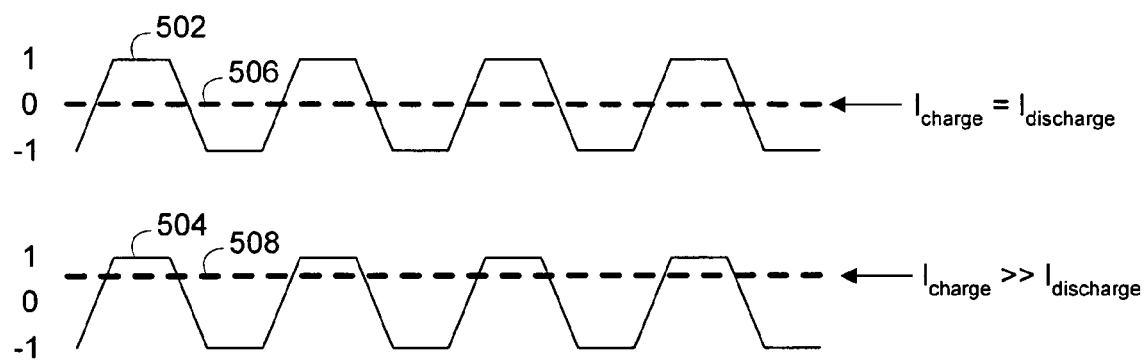
FIG. 5 shows illustrative output graphs of the amplitude detection circuitry assuming the charge current is equal to and much greater than the discharge current in accordance with one embodiment of the invention.

Ideally, the charge current is much greater than the discharge current. This causes the output of the operational amplifier to be rectified. For example, FIG. 5 includes illustrative graphs 500 showing the outputs of the operational amplifier for two charge and discharge current values. The top graph shows illustrative amplifier output 506 when the charge current is approximately equal to the discharge current. In the example of FIG. 5, amplifier output 506 is approximately zero since the charge and discharge currents are approximately the same and the average value of signal 502 is approximately zero. As the charge current is increased, however, output 508 approaches the maximum value of signal 504. In the example of FIG. 5, this maximum value approaches one.

Several constraints determine the value of the discharge current. First, some discharge current is required because the discharge current allows the circuitry to detect if the input signal is reducing in amplitude. If there was no discharge current, the circuitry would only detect and hold the maximum value of the input signal. Second, there is usually some specification which specifies the amount of time to detect when the signal is less than a predetermined amplitude threshold value. After the specified amount of time has passed, signal detect (SD) should be deasserted. Third, in all practical operational amplifier designs, a large mismatch between the charge and discharge currents leads to large offsets. The integration capacitor is used to average out the rectified value to reduce any instantaneous transient effects. These transient effects may lead to skewed results. The size of the integration capacitor and the time required to detect the signal being less than some predetermined threshold amplitude may govern the discharge current in accordance with:

$$I = C \frac{dv}{dt} \quad \text{(EQ 1)}$$

where I is the value of discharge current, C is the capacitance of the integration capacitor, and dv is the voltage difference of the largest signal amplitude minus the reference threshold level required to detect a valid signal (i.e., the signal detect (SD) threshold).

Figure 6:
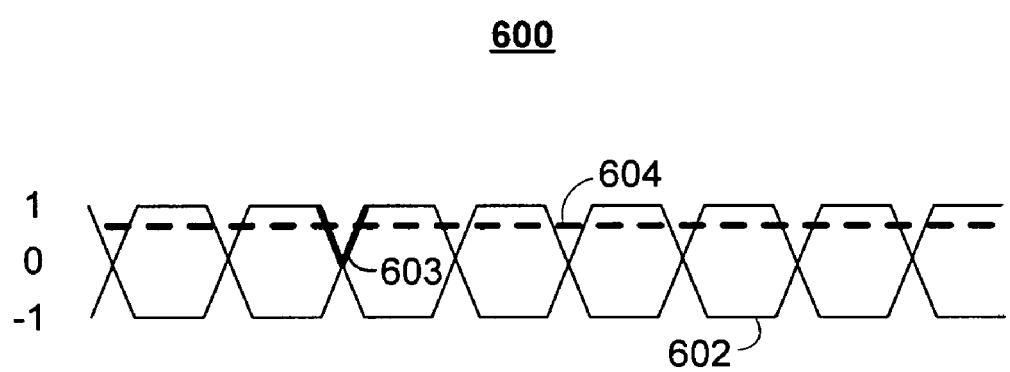
FIG. 6 shows the rectification signal of an illustrative differential signal in accordance with one embodiment of the invention.

FIG. 6 shows graph 600 in accordance with one embodiment of the invention. Differential signal 602 includes a positive and negative component. Rectification of signal 602 causes output 604 of the operational amplifier to approach the maximum value of differential signal 602. However, output 604 will be slightly less than the actual amplitude of signal 602 due to the finite amount of discharge current required to detect when the signal amplitude has decreased below the signal detect threshold. The dips in the operational amplifier input, such as dip 603, therefore cause the rectified output value to be slightly less than the actual signal amplitude. The more dips in the signal, the lower the resulting rectified output value. Therefore, the detected amplitude of a differential input signal with a high transition density may be lower that a differential input signal with a low transition density. This is a type of pattern-dependency and is highly undesirable in high-speed signaling applications.

FIG. 7 shows illustrative circuitry 700 in accordance with the invention. Circuitry 700 eliminates or reduces the number of dips in the input to the rectifier circuitry. The differential input signals Vin+ and Vin− are first received by one or more delay blocks 702 and 704. Delay blocks 702 and 704 may delay or phase shift the differential input signals by a fixed or variable amount. For example, delay block 702 may delay the differential input signals by 30 degrees and delay block 704 may delay the differential input signals by 60 degrees, etc.

The number of delay blocks and the amount of delay for each block may be varied without departing from the spirit of the invention. In some embodiments, the delay for each of the delay blocks and the number of delay blocks are programmable parameters, which may be dynamically reconfigured or reprogrammed on-the-fly to adjust for various attributes of the differential signal input. For example, differential input signals with higher transition densities may pass through more delay blocks than input signals with lower transition densities. As another example, differential input signals with slow edge rates may pass through more delay blocks than signals with sharp edge rates. Regardless of the number of delay blocks and the amount of delay used, the delay circuitry sends at least one delayed version of the differential input signals Vin+ and Vin− to the rectifier circuitry.

After passing through one or more delay stages, the delayed versions of the differential input signals are received by the rectifier circuitry. In the example of FIG. 7, the rectifier circuitry includes at least one operational amplifier, such as operational amplifier 706; however, the rectifier circuitry may include one or more diodes or other suitable rectifier circuitry in other embodiments. Operational amplifier 706 is configured in a voltage follower or buffer amplifier configuration so that the output of the amplifier follows the input. The number of inputs of operational amplifier 706 depends on the number of delay stages used. For example, if one delay stage is used, then the original differential input signals and the delayed version of the signals may both be received by operational amplifier 706. If more than one delay stage is used, the output of each stage may be received by operational amplifier 706.

In addition to sending one or more delayed versions of the differential signal inputs to the rectifier circuitry, delay blocks 702 and 704 should also have sufficient bandwidth so that the original signal is sent without any attenuation. For example, the bandwidth of the delay circuitry should be wide enough so that the one or more delayed versions of the differential signals are sent to the rectifier circuitry without any distortions for the frequencies of interest.

Similar to capacitor 304 (FIG. 3), capacitor 708 is allowed to charge to the rectified voltage level output, $V_{rect}$, of operational amplifier 706. Therefore, in some embodiments, the charging time of the capacitor is shorter than the period of the highest appreciable frequency component of the differential input signal. Discharge current 710 is depicted in FIG. 7 external to operational amplifier 706. As described above, however, in most actual implementations, discharge current 710 is integrated within operational amplifier 706. Discharge current 710 may compensate for any voltage drop in the input signal by detecting a drop in voltage of the input signal.

Figure 8:
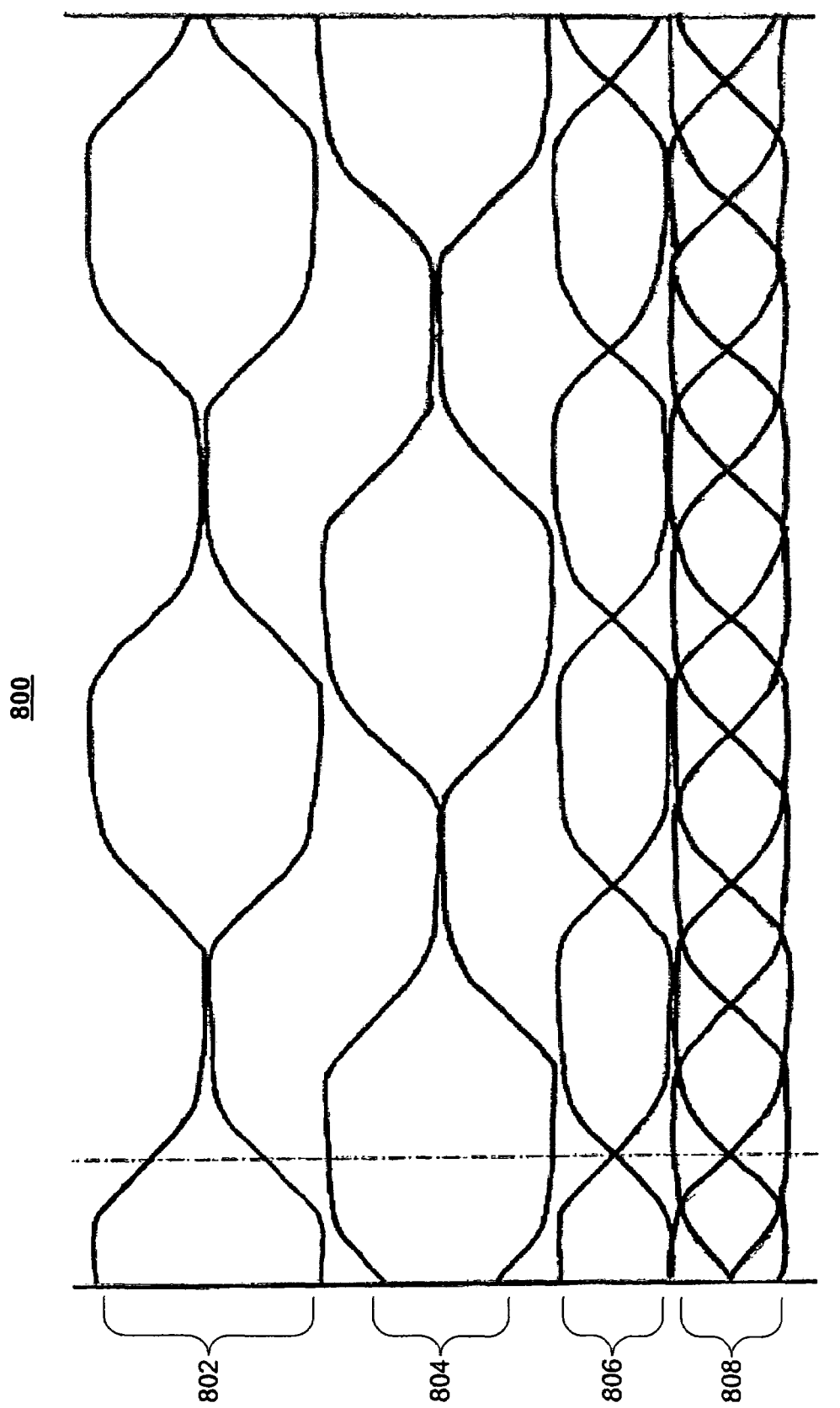
FIG. 8 is an illustrative graph of delayed versions of differential signals shifted approximately 90 degrees in accordance with one embodiment of the invention.

FIG. 8 shows illustrative graph 800 with four plots. Differential signal pair 802 represents the positive and negative differential signals, Vin+ and Vin−. Signal pair 804 represents a delayed version of differential signals 802. For example, delay block 702 may produce a delayed version of the differential input signals that is shifted by 90 degrees. Signals 806 represent the waveforms seen by the rectifier circuitry corresponding to differential signal pair 802. Similarly, signals 808 represents the original differential signal pair and the delayed version as seen by the rectifier circuitry. As shown in FIG. 8, signals 808 may reduce the dips seen by the rectifier circuitry. By adding more delayed versions of the differential input signal, the dips may be reduced or eliminated altogether. Since the rectifier circuitry now is responsive to an input signal with smaller dips, the charge and discharge currents of the rectifier circuitry may output a rectified voltage level closer to the actual amplitude of the differential input signal.

Figure 9:
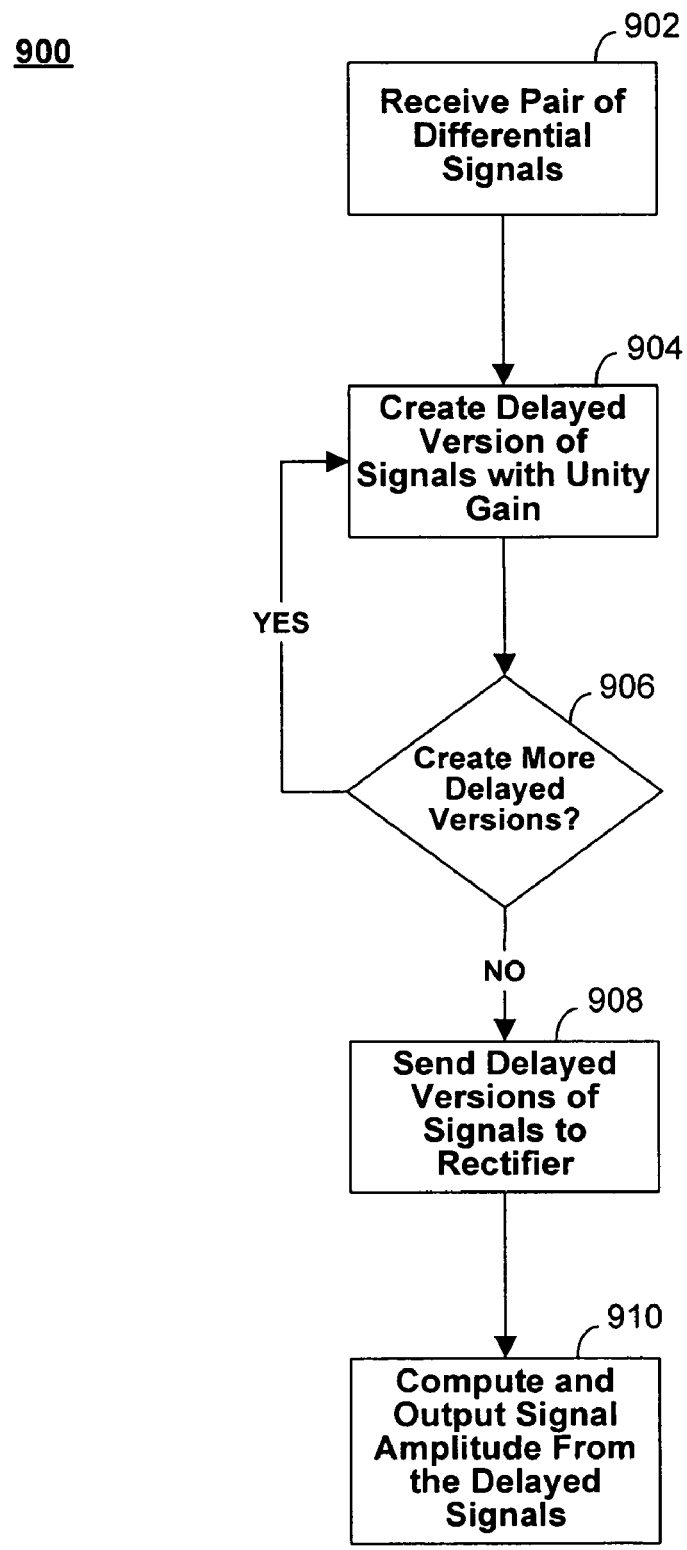
FIG. 9 shows an illustrative process for detecting the amplitude of a pair of differential signals using the amplitude detection circuitry of FIG. 7.

FIG. 9 shows illustrative process 900 for detecting the amplitude of a pair of differential signals. At step 902, a pair of differential signal inputs is received. At step 904 delay circuitry creates a delayed version of the input signals. For example, delay block 702 (FIG. 7) may produce a signal delayed by 90 degrees from the input signal. At step 906, a determination is made whether more delayed versions of the input signals should be created. For example, the delay circuitry may comprise one or more delay blocks, or stages, and these blocks, or stages, may be user-programmable. In some embodiments, the number of delayed versions of the input signals to create may be pre-programmed or dynamically reconfigured on-the-fly. If, at step 906, a determination is made that more delayed versions of the input signals should be created, then one or more delayed versions are created at step 904. Each delayed version of the input signals may be delayed by the same (relative) amount or by a variable amount.

If there are no more delayed versions of the input signals to create, then at step 908 the delayed versions of the input signal created at step 904 are sent to rectifier circuitry. In some embodiments, the original differential input signals may be also sent to the rectifier circuitry. The rectifier circuitry may include, for example, one or more operational amplifiers (in a voltage follower configuration as shown in FIG. 7) or one or more diodes. The amplitude of the differential input signals is then computed from the one or more delayed versions of the input signal (and, optionally, the original differential input signals as well) at step 910.

Figure 10:
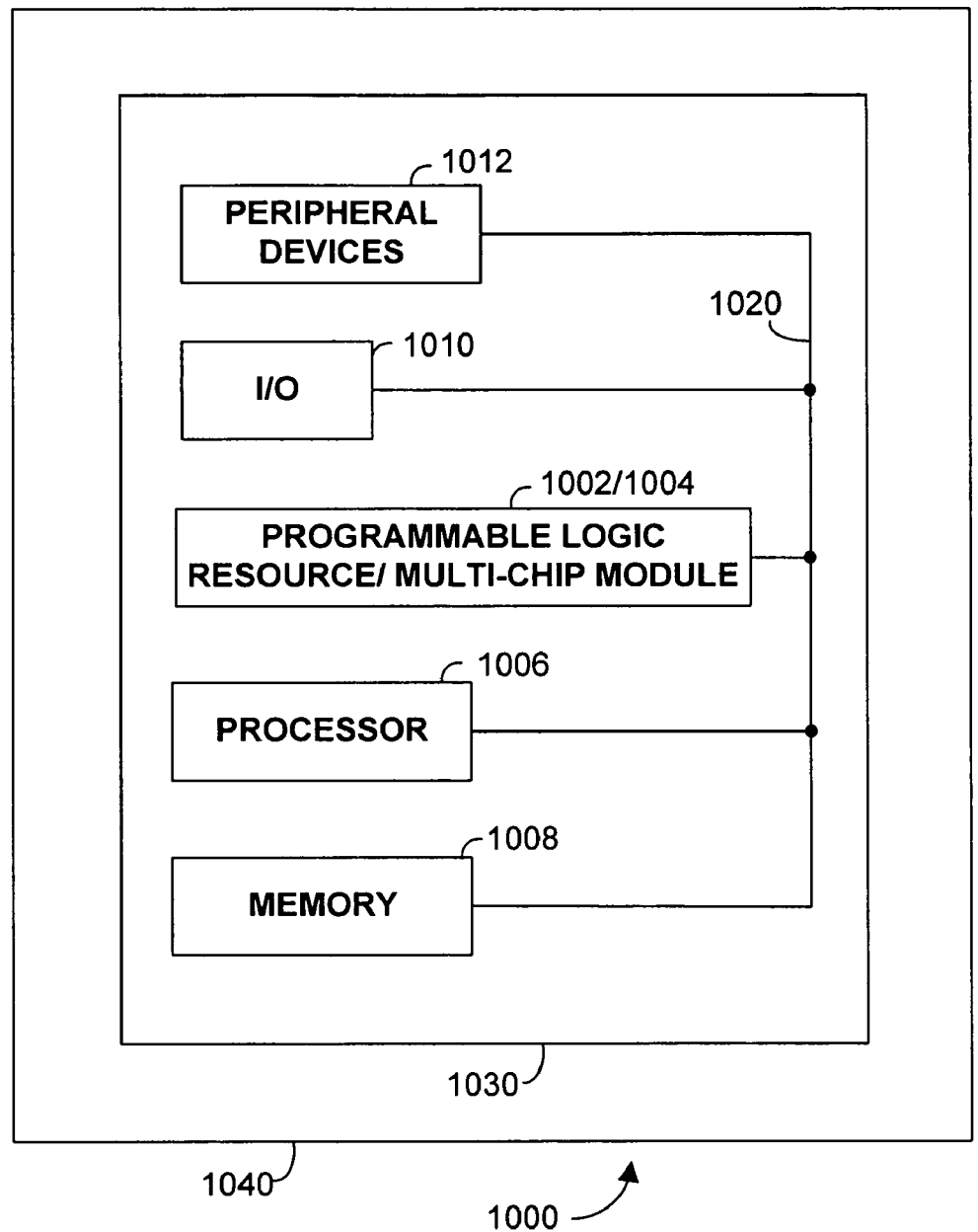
FIG. 10 is a simplified schematic block diagram of an illustrative system employing a programmable logic resource, multi-chop module, or other suitable device in accordance with the invention.

FIG. 10 illustrates programmable logic resource 1002, multi-chip module 1004, or other device (e.g., ASSP, ASIC, full-custom chip, dedicated chip), in accordance with embodiments of the invention in a data processing system. Data processing system 1000 may include one or more of the following components: processor 1006, memory 1008, I/O circuitry 1010, and peripheral devices 1012. These components are coupled together by a system bus or other interconnections 1020 and are populated on circuit board 1030, which is contained in end-user system 1040. For example, interconnections 1020 may include standard PCI, PCI-X, or PCI Express interconnections. The precision signal amplitude detection circuitry in accordance with the invention may be used to detect the amplitude of any signal within end-user system 1040. For example, circuitry 700 (FIG. 7) may be incorporated on one or more input pins of programmable logic resource 1002 and/or multi-chip module 1004 to assist in signal amplitude detection, envelope detection, or differential signaling.

It will be understood that the foregoing is only illustrative of the principles of the invention, and that various modifications can be made by those skilled in the art without departing from the scope and spirit of the invention. For example, although differential signals are used in the depicted embodiment of FIG. 7, a single trace may be used in other embodiments. In addition, depending on the application, there may be more or less delay stages than shown in the depicted embodiments.

What is claimed is:

1. Amplitude detection circuitry comprising:
    delay circuitry comprising a plurality of delay stages to receive a differential signal input and to output a plurality of delayed versions of the received differential signal input; and
    rectifier circuitry responsive to the output of the delay circuitry to detect the amplitude of the differential signal input from the differential signal input and the plurality of delayed versions of the received differential signal input, wherein the rectifier circuitry comprises an operational amplifier and wherein a discharge current and a charge current that is greater than the discharge current are integrated within the operational amplifier.

2. The circuitry of claim 1 wherein each of the plurality of delay stages is configured to output a different delayed version of the received differential signal input.

3. The circuitry of claim 1 wherein the delay circuitry outputs one delayed version of the received differential signal input that is delayed by 90 degrees.

4. The circuitry of claim 1 further comprising a user-programmable input, wherein the delay circuitry outputs one delayed version of the received differential signal input that is delayed by an amount determined, at least in part, by the user-programmable input.

5. The circuitry of claim 1 wherein the operational amplifier is in a voltage follower configuration.

6. A programmable logic resource comprising the amplitude detection circuitry of claim 1.

7. The circuitry of claim 1 wherein the rectifier circuitry further comprises an integration capacitor to store an output of the operational amplifier.

8. A method for detecting the amplitude of a differential signal, the method comprising:
   receiving a differential signal input;
   generating a plurality of delayed versions of the received differential signal input;
   generating a rectified signal by rectifying the received differential signal input and the generated plurality of delayed versions of the received differential signal input, wherein the generating comprises storing the rectified signal using a discharge current and a charge current that is greater than the discharge current; and
   detecting the amplitude of the differential signal input by comparing the stored rectified signal with a reference voltage.

9. The method claim 8 wherein generating a plurality of delayed versions of the received differential signal input comprises generating a plurality of versions of the received differential signal input, each of the plurality of versions delayed by a different amount.

10. The method of claim 8 wherein generating a plurality of delayed versions of the received differential signal input comprises generating at least one version of the received differential signal input that is delayed by 90 degrees.

11. The method of claim 8 wherein the detecting further comprises outputting a signal when the detected amplitude is greater than the reference voltage.

12. Amplitude detection circuitry comprising:
   means for receiving a differential signal input;
   means for generating a plurality of delayed versions of the received differential signal input; and
   means for detecting the amplitude of the differential signal input from the differential signal input and the plurality of delayed versions of the received differential signal input, wherein the means for detecting comprises an operational amplifier and wherein a discharge current and a charge current that is greater than the discharge current are integrated within the operational amplifier.

13. The circuitry of claim 12 wherein the means for detecting further comprises means for storing an output of the operational amplifier.

14. The circuitry of claim 12 wherein the means for detecting further comprises means for comparing the detected amplitude to a reference voltage and means for outputting a signal when the detected amplitude is greater than the reference voltage.

15. The circuitry of claim 12 wherein the means for generating a plurality of delayed versions of the differential signal input comprises means for generating a plurality of versions of the received differential signal input, each of the plurality of versions delayed by a different amount.

16. The circuitry of claim 7 wherein the rectifier circuitry further comprises circuitry to compare a reference voltage to an output of the operational amplifier stored on the integration capacitor.

17. The method of claim 8 further comprising receiving a user-programmable input, wherein each of the generated plurality of delayed versions of the received differential signal input is delayed by an amount determined, at least in part, by the received user-programmable input.

18. The circuitry of claim 12 further comprising means for receiving a user-programmable input, wherein each of the generated plurality of delayed versions of the received differential signal input is delayed by an amount determined, at least in part, by the received user-programmable input.

* * * * *